(12) United States Patent
Bhingardive et al.

(10) Patent No.: US 12,740,084 B2
(45) Date of Patent: Sep. 15, 2026

(54) THIN-FILM TRANSISTORS AND RELATED METHODS OF MANUFACTURE WITH CHANNEL AND HARDMASK MATERIALS

(71) Applicant: ZINITE CORPORATION, Edmonton (CA)

(72) Inventors: Viraj Bhingardive, Edmonton (CA); Douglas Barlage, Edmonton (CA); Korel Dawkins, Edmonton (CA); Alex Ma, Edmonton (CA)

(73) Assignee: ZINITE CORPORATION, Edmonton (CA)

( * ) Notice: Subject to any disclaimer, the term of this patent is extended or adjusted under 35 U.S.C. 154(b) by 0 days.

(21) Appl. No.: 19/263,214

(22) Filed: Jul. 8, 2025

(65) Prior Publication Data

US 2026/0032940 A1 Jan. 29, 2026

Related U.S. Application Data

(60) Provisional application No. 63/713,504, filed on Oct. 29, 2024, provisional application No. 63/674,725, filed on Jul. 23, 2024.

(51) Int. Cl.

*H10D 30/67* (2025.01)
*H10D 30/01* (2025.01)
*H10P 50/00* (2026.01)
*H10P 76/40* (2026.01)

(52) U.S. Cl.

CPC ....... *H10D 30/031* (2025.01); *H10D 30/6713* (2025.01); *H10D 30/6755* (2025.01); *H10D 30/6757* (2025.01)

(58) Field of Classification Search

CPC ............... H10D 30/67; H10D 30/6713; H10D 30/6731; H10D 30/6734; H10D 30/6755; H10D 30/6756; H10D 30/6757; H01L 21/027; H01L 21/0273; H10P 50/69; H10P 76/40; H10P 76/408

See application file for complete search history.

(56) References Cited

U.S. PATENT DOCUMENTS 4,685,196 A 8/1987 Lee
5,851,926 A 12/1998 Kumar et al.
6,121,123 A 9/2000 Lyons et al.
6,444,505 B1 9/2002 Chen et al.
6,649,935 B2 11/2003 Hsu et al.
9,224,598 B2 12/2015 Choi et al.
9,450,072 B2 9/2016 Chou et al.
(Continued)

FOREIGN PATENT DOCUMENTS

WO WO-2019009872 A1 1/2019
WO WO-2019132894 A1 7/2019
(Continued)

*Primary Examiner* — Joshua Benitez Rosario
*Assistant Examiner* — John Lin
(74) *Attorney, Agent, or Firm* — PERRY + CURRIER INC.

(57) ABSTRACT

A thin-film transistor includes a source including a body of source material and a source carrier reservoir formed of reservoir material, a drain, and a layer of channel material positioned between source and the drain. A hardmask material may be used to pattern the source and drain. Remains of the hardmask may form the source carrier reservoir. The channel material and the reservoir material may be the same material, such as tin oxide.

17 Claims, 10 Drawing Sheets

(56) References Cited

U.S. PATENT DOCUMENTS

| | | | | |
|---|---|---|---|---|
| 11,011,550 | B2 | 5/2021 | Le et al. | |
| 2008/0286448 | A1* | 11/2008 | Elam | C23C 16/45527 427/255.35 |
| 2012/0025187 | A1 | 2/2012 | Park et al. | |
| 2012/0242627 | A1 | 9/2012 | Kim et al. | |
| 2016/0336460 | A1 | 11/2016 | Wang et al. | |
| 2017/0125249 | A1 | 5/2017 | Price et al. | |
| 2017/0148517 | A1 | 5/2017 | Harari | |
| 2017/0256650 | A1 | 9/2017 | Godo et al. | |
| 2017/0316953 | A1* | 11/2017 | Zhang | H01L 21/02244 |
| 2018/0006126 | A1* | 1/2018 | Hook | H01L 23/485 |
| 2018/0301371 | A1 | 10/2018 | Wang et al. | |
| 2020/0235092 | A1 | 7/2020 | Lilak et al. | |
| 2020/0266060 | A1 | 8/2020 | Cheng et al. | |
| 2021/0399141 | A1 | 12/2021 | Li et al. | |
| 2022/0336671 | A1 | 10/2022 | Dai et al. | |
| 2023/0090306 | A1 | 3/2023 | Young et al. | |
| 2023/0337454 | A1* | 10/2023 | Haas | H10K 50/852 |
| 2023/0361180 | A1 | 11/2023 | Sathaiya et al. | |
| 2023/0397426 | A1 | 12/2023 | Jiang et al. | |
| 2024/0170556 | A1* | 5/2024 | Chen | H01L 21/31116 |
| 2024/0213370 | A1 | 6/2024 | Barlage et al. | |

FOREIGN PATENT DOCUMENTS

| | | | |
|---|---|---|---|
| WO | WO-2023285936 | A1 | 1/2023 |
| WO | WO-2024134401 | A1 | 6/2024 |

* cited by examiner

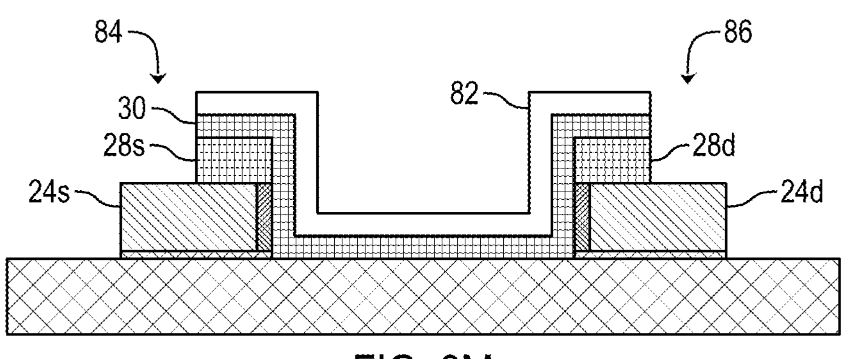
FIG. 2M
30
28s
28d
24s
24d
FIG. 2N
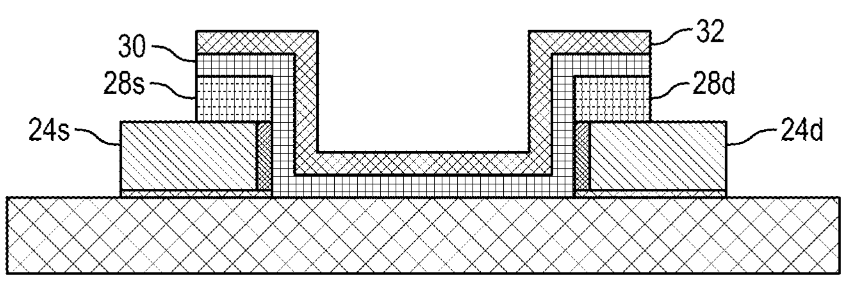
FIG. 2O

THIN-FILM TRANSISTORS AND RELATED METHODS OF MANUFACTURE WITH CHANNEL AND HARDMASK MATERIALS

CROSS-REFERENCE TO RELATED APPLICATIONS

This application claims priority to U.S. provisional application 63/674,725, filed Jul. 23, 2024 and U.S. provisional application 63/713,504, filed Oct. 29, 2024. The entire contents of the foregoing are incorporated herein by reference.

FIELD

The present invention relates to thin-film transistors and methods of making same.

BACKGROUND

Thin film transistors (TFTs) are presently widely employed in semiconductor devices. TFTs get their name from the fact that they are typically fabricated from very thin layers of semiconductor materials, metals, and insulators.

TFTs are manufactured using precision processes that are often complex. Decreasing complexity and increasing efficiency in the manufacturing TFTs is a continually sought after goal in the semiconductor industry. However, reaching this goal should not compromise TFT operational performance.

SUMMARY

According to one aspect of the present invention, a method of manufacturing a thin-film transistor includes forming a layer of source/drain material, forming a layer of hardmask material on the source/drain material, patterning the layer of hardmask material to form a hardmask, and transferring a pattern of the hardmask to the source/drain material to form a source and a drain. Remaining hardmask material forms a source carrier reservoir of the thin-film transistor.

Additional remaining hardmask material may form a drain reservoir.

The method may further include forming a layer of channel material between the source and drain. The channel material may be the same as the hardmask material.

The forming of the layer of hardmask material and the forming of the layer of channel material may be performed by the same process. The process may be atomic layer deposition. A parameter of the process, such as temperature, may be changed between the forming of the layer of hardmask material and the forming of the layer of channel material.

The hardmask material may include a metal-oxide semiconductor. The hardmask material may be tin oxide.

According to another aspect of the present invention, a method of manufacturing a thin-film transistor includes forming a layer of source/drain material, patterning the source/drain material to form a source and a drain, forming a source carrier reservoir of reservoir material at the source, and forming a layer of channel material between the source and drain. The channel material is the same as the reservoir material.

The method may further include forming a layer of the reservoir material on the source/drain material, patterning the layer of reservoir material to form a hardmask, and transferring a pattern of the hardmask to the source/drain material to form the source and the drain. The remaining hardmask material forms the source carrier reservoir.

The method may further include forming a drain reservoir of the reservoir material at the drain.

The source/drain material may include ruthenium.

The reservoir material and the channel material may include a metal-oxide semiconductor. The reservoir material and the channel material may be tin oxide.

According to another aspect of the present invention, a thin-film transistor includes a source including a body of source material and a source carrier reservoir formed of reservoir material, a drain, and a layer of channel material positioned between source and the drain. The channel material and the reservoir material are tin oxide.

The drain may include a drain reservoir formed of the reservoir material.

The reservoir material may include remains of a hardmask used to pattern the body of source material.

The reservoir material may be doped with antimony. The antimony may have a concentration of about 1 atomic % or less with respect to tin atoms of the reservoir material.

According to another aspect of the present invention, a method of manufacturing a thin-film transistor includes forming a layer of source/drain material, forming a layer of metal-oxide semiconductor on the source/drain material, patterning the layer of metal-oxide semiconductor to form a hardmask, and transferring a pattern of the hardmask to the source/drain material to form a source and a drain of the thin-film transistor.

The metal-oxide semiconductor may be tin oxide.

According to another aspect of the present invention, a method of manufacturing a thin-film transistor includes forming a layer of source/drain material, patterning the source/drain material to form a source and a drain, forming a source carrier reservoir of reservoir material at the source, and forming a layer of channel material between source and the drain. The channel material is tin oxide. The reservoir material is tin oxide that is doped with a dopant.

The dopant may include antimony. The antimony may have a concentration of about 1 atomic % or less with respect to tin atoms of the tin oxide.

According to another aspect of the present invention, a thin-film transistor includes a source including a source carrier reservoir formed of reservoir material, a drain, and a layer of channel material positioned between source and the drain. The channel material is tin oxide. The reservoir material is tin oxide that is doped with a dopant.

The dopant may include antimony. The antimony may have a concentration of about 1 atomic % or less with respect to tin atoms of the tin oxide.

These and other aspects of the present invention will be discussed in detail below.

DETAILED DESCRIPTION

The present invention relates to reducing manufacturing complexity of TFTs while maintaining or improving their operational performance. One aspect of the present invention is that a hardmask is used to etch source/drain material and a portion of the hardmask remains in the completed TFT as a source carrier reservoir and, optionally, a drain reservoir. Use of a hardmask improves definition of the resulting source, drain, and gap between the source and the drain. Another aspect of the present invention is that the channel material is the same as the material of the source carrier reservoir and, in combination with the aforementioned aspect, the same as the hardmask material. Using the same material for various elements of the TFT reduces the number of different materials required and thus simplifies the manufacturing process. In addition, the channel and reservoir material may be formed using the same process, which further reduces complexity. Further, providing a source carrier reservoir improves operational performance. These and other aspects and advantages of the present invention will be discussed in greater detail below.

Figure 1:
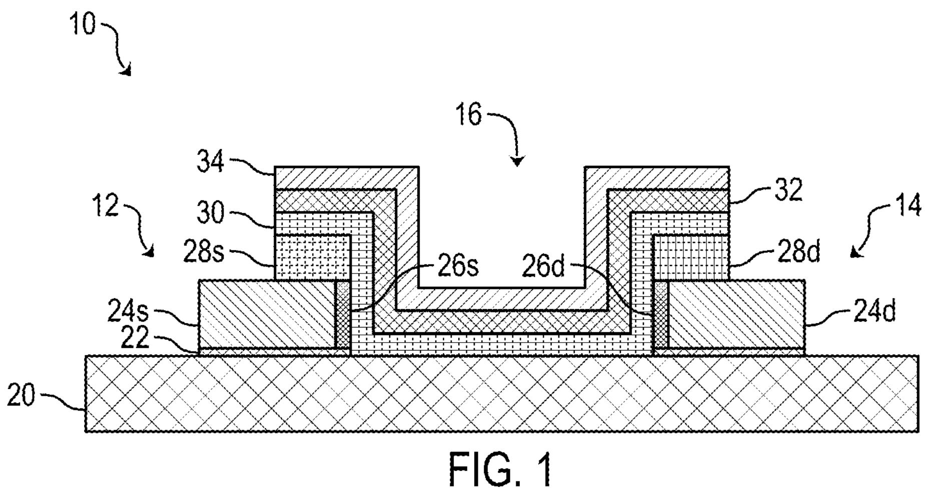
FIG. 1 is a cross-sectional view of an example thin-film transistor according to the present invention.

FIG. 1 shows an example thin-film transistor (TFT) 10 according to the present invention. The TFT 10 includes a source 12, drain 14, and gate 16.

The TFT 10 is formed with a substrate 20. The substrate 20 may be disposed over another layer of TFTs, whether manufactured in accordance with the present invention or by another technique, or over a layer of complementary metal-oxide semiconductor (CMOS) devices or other front-end-of-line (FEOL) devices. The TFT 10 may be manufactured using back-end-of-line (BEOL) and/or middle-of-line (MOL) processes.

Examples of substrates 20 include silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, organosilicate glass, glass, flexible polymers, plastic, a silicon wafer whose surface is processed with wet thermal oxide (WTO), etc.

Adhesion material 22 may be provided over the substrate to promote adhesion of subsequently formed material. In this example, the adhesion material 22 is titanium nitride. In other examples, hafnium nitride or tin oxide may be used as the adhesion material 22. Use of the adhesion material 22 is presently preferred. However, in various examples, one of ordinary skill in the art would understand that adhesion material 22 could be omitted.

The source 12 is formed of a body of source material **24*s*, which in this example may be tungsten, ruthenium, molybdenum, cobalt, tantalum, nickel, copper, etc. Heavily doped n-type materials may be used, and in some circumstances other materials may be used as the source material 24*s*. Further examples of source material 24*s*** include degenerate n-type silicon and III-V compound semiconductors with high conductivity with predominately n-type or electron transport.

The source material **24*s* may be treated to form a source-channel interface 26*s* that includes a p-type semiconductor that faces inward towards the gate 16**.

The drain 14 may have the same or similar material and/or structure as the source 12. In this example, the drain 14 is formed of a body of drain material **24*d*, which may be treated to form a drain-channel interface 26*d* that includes a p-type semiconductor that faces inward towards the gate 16. In other examples, the drain 14 has a material and/or structure different to the source 12**.

In this example, both source-channel interface **26*s* and drain-channel interface 26*d* are provided. In other examples, only the source-channel interface 26*s* is provided and the drain-channel interface 26*d* is omitted. In still other examples, the channel interfaces 26*s*, 26*d*** are omitted.

It is important to note that, in this example, the faces of source material **24*s* and drain material 24*d* opposite the substrate 20 (the upper faces in the orientation depicted) are not treated to form channel interface material. As such, the upper faces of the source material 24*s* and drain material 24*d* do not have same composition as the channel interfaces 26*s*, 26*d*. It has been found that treating the upper regions of the source material 24*s* and drain material 24*d* can add capacitance and/or can increase the threshold voltage of the TFT 10. When these effects are undesirable, restricting the treatment of channel interfaces 26*s*, 26*d*** to the inward faces is useful.

The source 12 further includes a source carrier reservoir **28*s* formed of reservoir material, which is an oxide semiconductor and preferably a metal-oxide semiconductor, such as tin oxide or zinc oxide. The source carrier reservoir 28*s* may have a naturally high concentration of n-type carriers. The source carrier reservoir 28*s* may be doped to further increase its n-type concentration. Other examples of materials that may be used for the source carrier reservoir 28*s*** include titanium oxide, indium gallium zinc oxide (IGZO), tungsten oxide, and indium tin oxide (ITO).

The source carrier reservoir **28*s* is formed over (with respect to the depicted orientation) and in contact with the source material 24*s*. In this example, the source carrier reservoir 28*s* includes remains of a hardmask, as will be discussed in detail below. The source carrier reservoir 28*s* may be formed to a thickness of about 5 nm to about 20 nm or more. More specifically, in various examples, the thickness of the source carrier reservoir 28*s*** is about 7 nm to about 10 nm.

In various examples, the source carrier reservoir **28*s*** is tin oxide ($SnO_2$) that is doped with about 1 atomic % or less of antimony with respect to tin, with antimony atoms replacing tin atoms. Example doping concentrations include the range from about 0.1 to about 1 atomic %. This may increase conductivity and availability of electrons. The tradeoff would be reduced mobility. Other potential dopants include other Group 15 (also termed Group VA or 5A) elements, such as phosphorus and arsenic, which are contemplated to replace oxygen atoms of the tin oxide.

The drain 14 may include a drain reservoir **28*d*. The drain reservoir 28*d* may have the same or similar structure and/or material as the source carrier reservoir 28*s*. In this example, the drain reservoir 28*d* is formed of the same reservoir material (e.g., tin oxide) disposed over and in contact with the drain material 24*d*. Likewise, in this example, the drain reservoir 28*d* also includes remains of the hardmask, as will be discussed below. The drain reservoir 28*d*** may be omitted.

The TFT 10 further includes a body of channel material 30 disposed between the source 12 and drain 14. The channel material 30 is an oxide semiconductor, preferably a metal oxide, and may be n-type. In this example, the channel material 30 is disposed over and between the reservoirs 28*s*, 28*d* and over the substrate 20 between the source and drain material 24*s*, 24*d*.

The channel material 30 is preferably the same material as the reservoirs 28*s*, 28*d*. In various examples, the channel material 30 and reservoirs 28*s*, 28*d* are composed of tin oxide. In implementations where the reservoirs 28*s*, 28*d* are doped, the channel material 30 may be undoped for sake of stability.

In this example, channel material 30 is about 7 nm to about 10 nm thick.

Source carrier reservoir 28*s* acts as a charge source adjacent source material 24*s* and channel material 30 to provide a reservoir of negative charge carriers to mitigate carrier starvation. If used, drain reservoir 28*d* may serve a similar purpose for the drain 14.

The TFT 10 further includes a body of gate dielectric material 32 disposed over the channel material 30 and a body of gate material 34 disposed over the gate dielectric material 32. The gate dielectric material 32 may be formed of a high-k dielectric, such as hafnium oxide. Other examples of gate dielectric materials 32 include silicon dioxide, silicon nitride, zirconium oxide, and aluminum oxide. The gate material 34 may be tungsten, titanium, molybdenum, gold, platinum, aluminum, nickel, copper, chromium, hafnium, indium, manganese, iron, vanadium, zinc, tantalum, or combination/alloy thereof.

The source-channel interface 26*s* is used to increase the threshold voltage at which TFT 10 turns ON, making the transistor operate in enhancement mode, to reduce leakage current through TFT 10 in the OFF state.

Specifically, source-channel interface 26*s* is provided to create a repository of complimentary excess positive charge that functions to deplete the channel in at least the region of channel material 30 adjacent source material 24*s* and source carrier reservoir 28*s*. In this manner, source-channel interface 26*s* serves as a voltage-controlled electron transport barrier, resulting in substantially less current flow through channel material 30 when TFT 10 is in an OFF state.

Further, source-channel interface 26*s* can also serve to reduce stress induced leakage currents ("SILC") in TFT 10 by inhibiting the formation of interlayer stress-induced flaws between channel material 30 and source material 24*s*.

As mentioned above, in this example, the source-channel interface 26*s* is a p-type semiconductor. Treatment of the source material 24*s* to obtain the source-channel interface 26*s* may include oxidation, atomic layer deposition (ALD), etc. In this example, the source material 24*s* is treated with oxygen plasma and it is contemplated that the resulting source-channel interface 26*s* includes oxidized source material 24*s*.

For example, when implemented as a p-type semiconductor, source-channel interface 26*s* may consist of an oxide or a sulfide of the source material 24*s*. In other examples, source-channel interface 26*s* may include elemental germanium or source-channel interface 26*s* may be formed by using a p-type dopant in a relevant portion of channel material 30. In other examples, source-channel interface 26*s* may consist of or include another element corresponding to group VI(A) of the periodic table, such as silicon nitride, nickel oxide, copper oxide, molybdenum oxide, iridium oxide, or a metal ion paired with a chalcogen, such as oxygen, sulfur, selenium, or tellurium compounds.

Source-channel interface 26*s* may alternatively or additionally be formed by a catalytic growth of source material 24*s*, such as ruthenium and ruthenium oxide, tungsten and tungsten oxide, other metals that form self-limiting oxide layers, or degeneratively doped poly-crystalline silicon in combination with a chemically limited silicon dioxide or a nitride barrier layer. In the example of oxidizing the source material to obtain the interface 26*s*, the oxygen may preferentially traverse source material 24*s* to form interface 26*s*. Metals that do not normally form self-limiting oxides, such as molybdenum, may be used provided that the formation process includes a step to limit oxidation. In other examples, source-channel interface 26*s* may be formed by depositing a p-type material, such as a p-type metal oxide or another semiconductor, by way of a deposition technique, such as atomic layer deposition, sputtering, chemical vapor deposition (CVD), or plasma enhanced CVD (PECVD).

The above also generally applies to the drain-channel interface 26*d*, if used.

Due to the efficacy of source-channel interface 26*s*, TFT 10 has sufficient carrier mobility such that carrier starvation could be an issue when in the ON state.

Source carrier reservoir 28*s* may cause the electron barrier between the channel formed in channel material 30 and source carrier reservoir 28*s* and source material 24*s* to be reduced or minimized, or to form a slowly increasing gradient, so that electrons do not experience a significant reflection probability when traversing the boundary between source carrier reservoir 28*s*, source material 24*s*, and channel material 30.

In various examples, source carrier reservoir 28*s* preferably has an effective electron mass, or density, of available electronic states that are at the same or similar level as the channel material 30. This is achieved in the example of FIG. 1 with the source carrier reservoir 28*s* and channel material 30 being the same material, for example, tin oxide.

Drain reservoir 28*d* serves as an electron receiver to enhance the flow of electrons out of the channel formed in channel material 30.

Figure 2A:
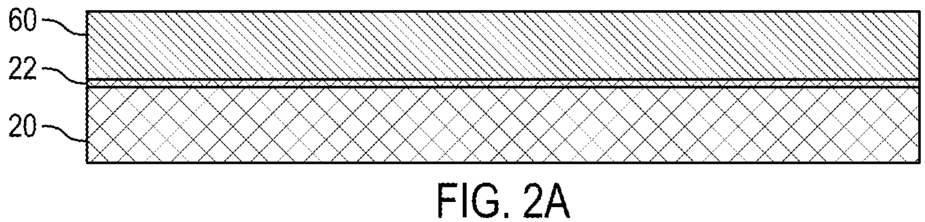
FIGS. 2A-2P are cross-sectional views of an example method of manufacturing a thin-film transistor according to the present invention.
Figure 2B:
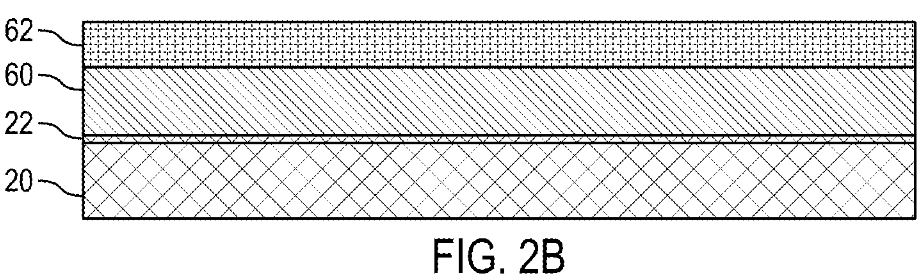
Figure 2C:
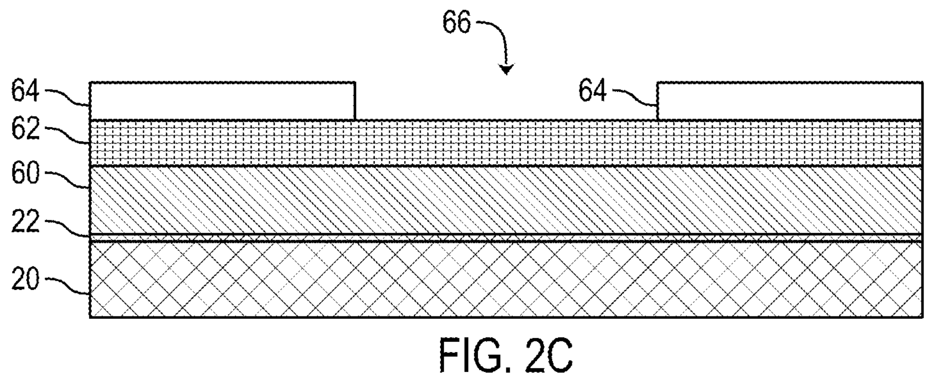
Figure 2D:
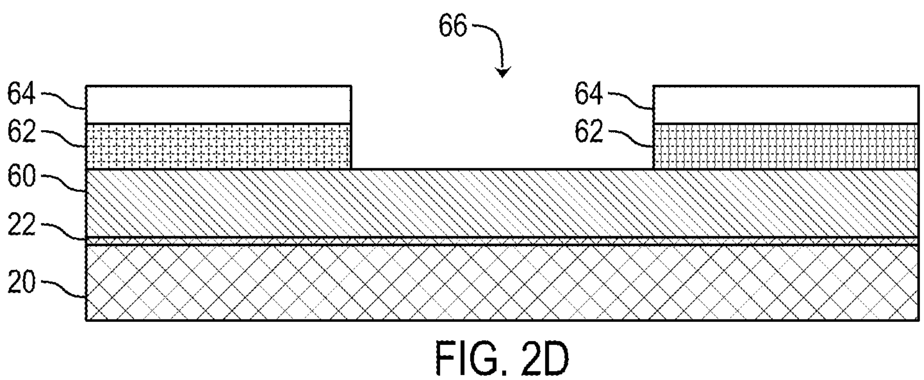
Figure 2E:
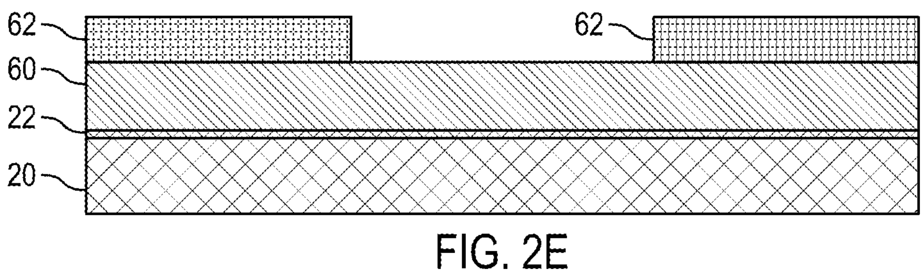
Figure 2F:
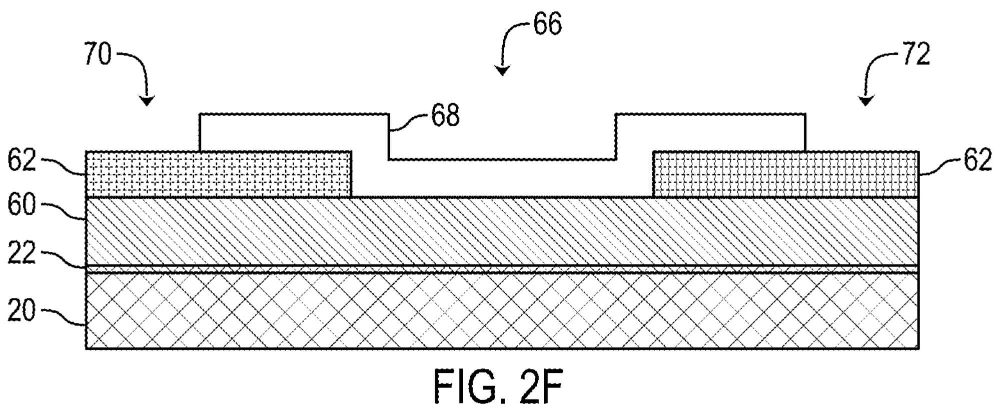
Figure 2G:
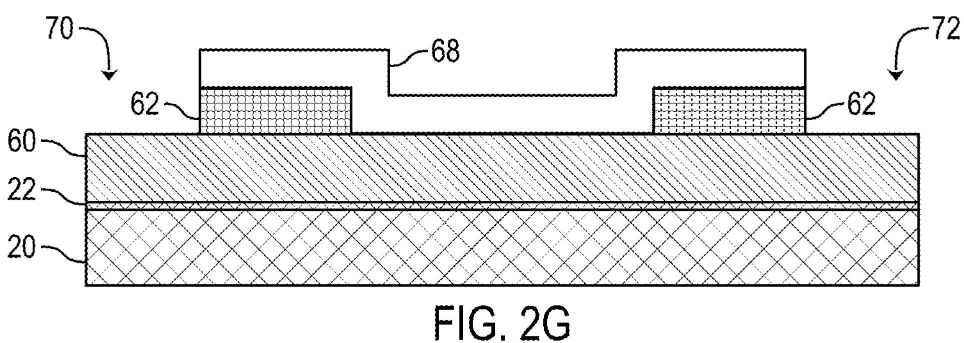
Figure 2H:
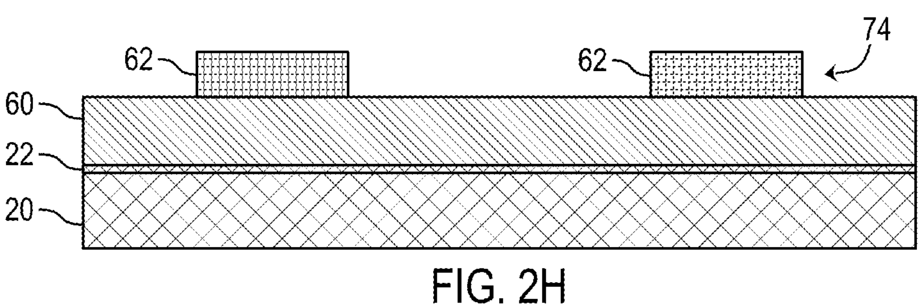
Figure 2I:
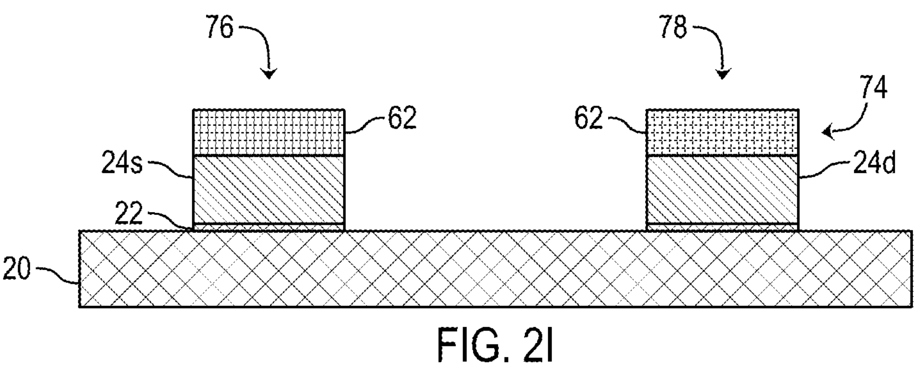
Figure 2J:
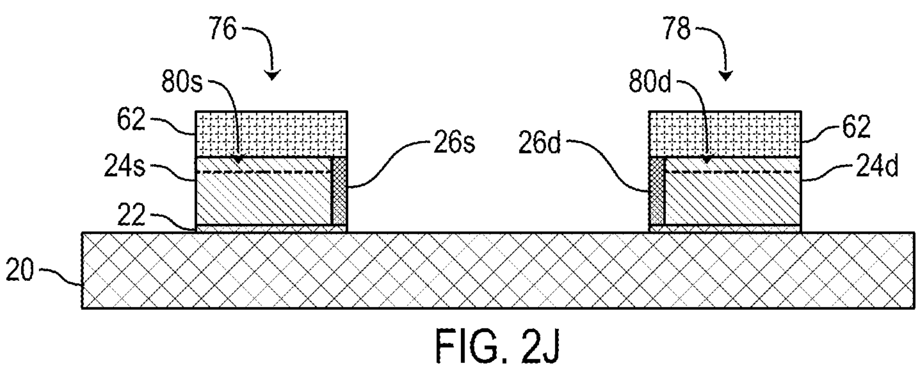
Figure 2K:
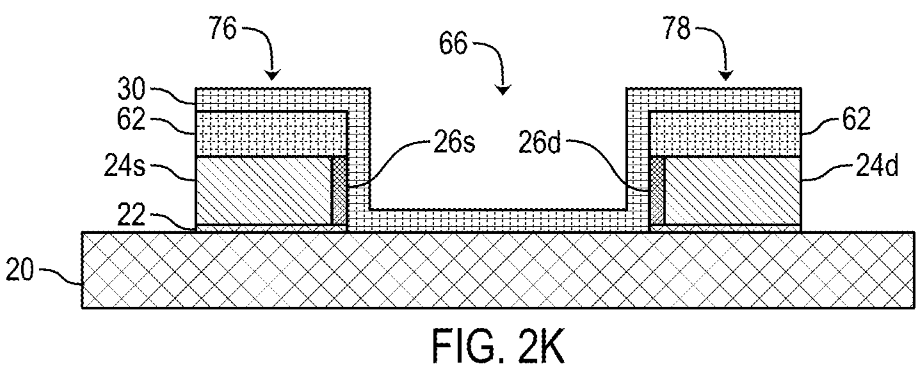
Figure 2L:
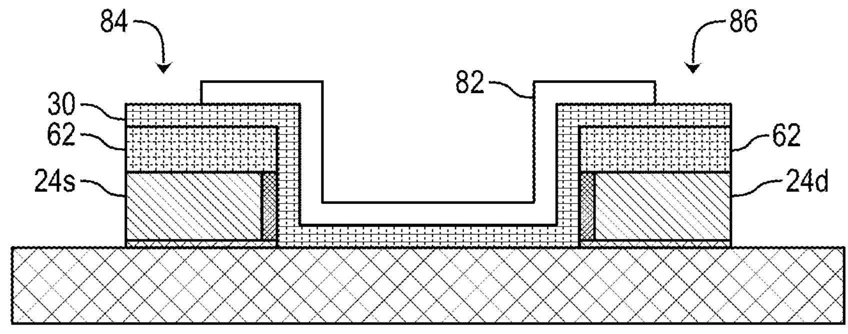
Figure 2P:
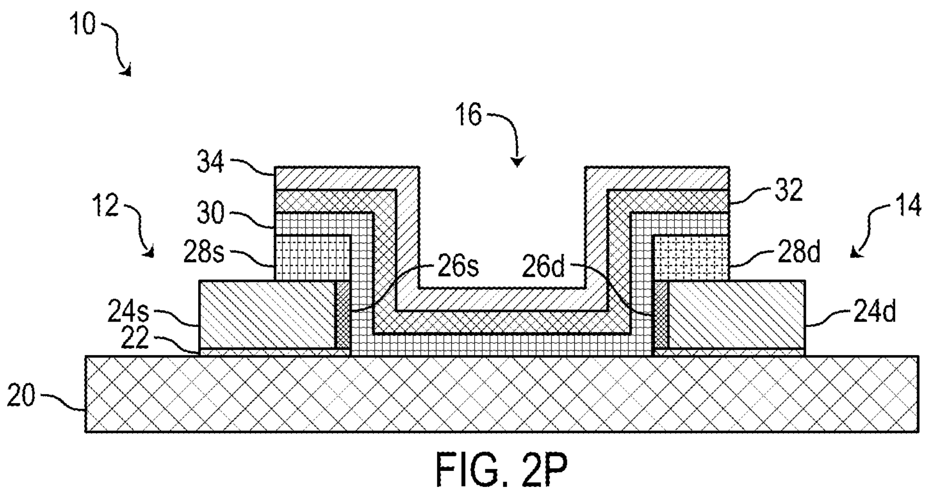

FIGS. 2A-2P show an example method of forming a TFT, such as the TFT 10 discussed above, according to the present invention. Advantageously, the method may be performed using BEOL and/or MOL processes. The method may be used to form a layer of TFTs 10 over other devices made using FEOL, MOL, or BEOL processes. In addition, it is noted that the method is described with respect to example materials. It should be understood that the method may use any suitable materials discussed above with regard to the TFT 10.

The manufacture of materials, layers, and/or features of semiconductor devices is referred to herein as "forming." As will be apparent to those of ordinary skill in the art, unless otherwise mentioned, "forming" is intended to include all semiconductor manufacturing techniques suitable and applicable therefor including, without limitation, deposition (i.e., chemical, atomic layer, physical vapor, etc.), sputtering, plasma enhanced chemical vapor deposition (PECVD), implantation, annealing, oxidation, and similar processes.

As shown in FIG. 2A, the method starts with a substrate 20, such as silicon dioxide, glass, etc., as discussed above. A layer of adhesion material 22 and a layer of source/drain material 60 are formed in turn on the substrate 20. The adhesion material 22, such as titanium nitride can be formed in any suitable manner, such as by ALD or sputtering, etc.

The adhesion material 22 enhances the adhesion of source/drain material 60 to the substrate 20. Examples of other suitable adhesion materials include hafnium nitride, zirconium nitride, and similar.

The source/drain material 60 may be deposited by sputtering. The layer of source/drain material 60 may be referred to as a metal layer, bottom layer, or bottom metal layer.

The source/drain material 60 will form the source 12 and drain 14 of the completed TFT 10. In this example, both the source 12 and the drain 14 are formed of the same material. However, as will be apparent to those of ordinary skill in the art given this disclosure, the source and drain may be formed of a different material.

As shown in FIG. 2B, a layer of hardmask material 62 is formed over the source/drain material 60. In this example, the hardmask material 62 is tin oxide and, as will be further discussed below, advantageously the hardmask material 62 is the same as the channel material 30. The hardmask material 62 is deposited using ALD, which is the presently preferred forming process. In other examples, other deposition processes may be used to deposit the hardmask material 62. For example, hardmask material 62 may be formed by sputtering, which may be faster than ALD and may make the formation of thicker layers more efficient. As will be discussed below, the hardmask material 62 will be formed into a hardmask that is used to etch the source/drain material 60.

In this example, the hardmask material 62 is tin oxide formed using ALD at a temperature of between about 130 Celsius (C) and about 300 C, and more specifically between about 190 C and about 235 C. Tetraallytin ($C_{12}H_{20}Sn$) may be used as a precursor. The hardmask material 62 may be formed to a thickness of about 5 nm to about 20 nm or, more specifically, to a thickness of about 7 nm to about 10 nm.

The hardmask material 62 may be doped with about 1 atomic % or less of antimony with respect to tin, where antimony atoms replace tin atoms of the tin oxide. In addition or alternatively, other potential dopants, such as phosphorus and/or arsenic, may be introduced at a comparable concentration.

Next, source and drain "pillars" are formed using lithography and etching. First, the hardmask material 62 is patterned, as shown in FIGS. 2C to 2G, to form a hardmask that is then used to etch the source/drain material 60 and adhesion material 22, as shown in FIGS. 2H and 2I. Any suitable lithographic and etching processes may be used.

In the present example, a maskless lithography tool is used for patterning and an I-line photoresist is used. The thickness of the photoresist is about 500 nm to about 600 nm and the development time is about 60 seconds. De-ionized (DI) water is used as a stopper. It is contemplated that other comparable tools, photoresists, developers, etc. may be used in other examples, as would be apparent to one of ordinary skill in the art given the benefit of this disclosure.

To etch the hardmask material 62, an inductively coupled plasma reactive ion etching (ICPRIE) process may be used. Reactant gases may include fluoroform ($CHF_3$) and argon. Selectivity to the underlying source/drain material 60, when ruthenium is used, may be selected to be about 16. An over-etch factor of 20-30% may be used.

As shown in FIG. 2C, a lithographic patterning is performed, which includes applying a first pattern of photoresist 64 on the hardmask material 62. The first pattern of photoresist 64 defines a gap 66 within which hardmask material 62 will be etched.

As shown in FIG. 2D, the hardmask material 62 in gap 66 is etched according to the first pattern of photoresist 64 to expose the source/drain material 60 in gap 66.

Next, as shown in FIG. 2E, the first pattern of photoresist 64 is removed.

Next, as shown in FIG. 2F, a second lithographic patterning is performed. A second pattern of photoresist 68 is applied to the hardmask material 62 and source/drain material 60 within gap 66, leaving outer regions 70, 72 of the hardmask material 62 exposed for etching.

As can be seen in FIG. 2G, the hardmask material 62 is etched according to the second pattern of photoresist 68 to expose the source/drain material 60 at the outer regions 70, 72.

Figure 3A:
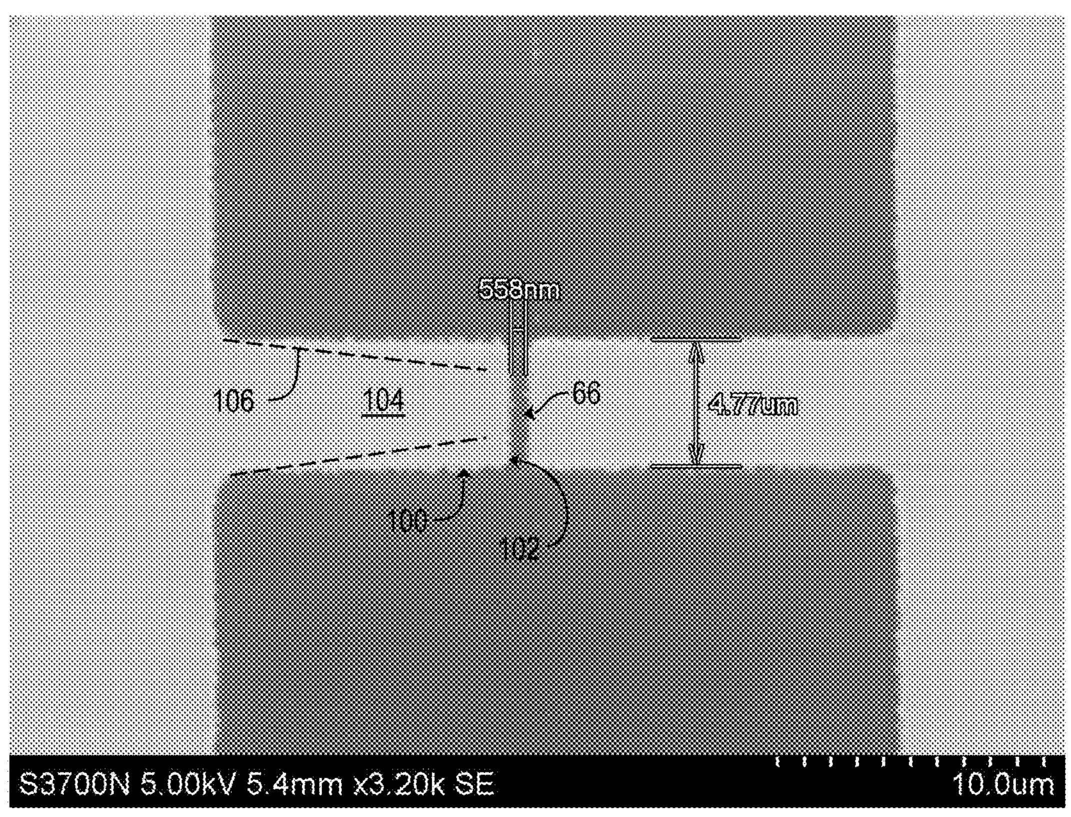
FIGS. 3A and 3B are scanning electron microscope (SEM) images of test devices made in accordance with the present invention.
Figure 3B:
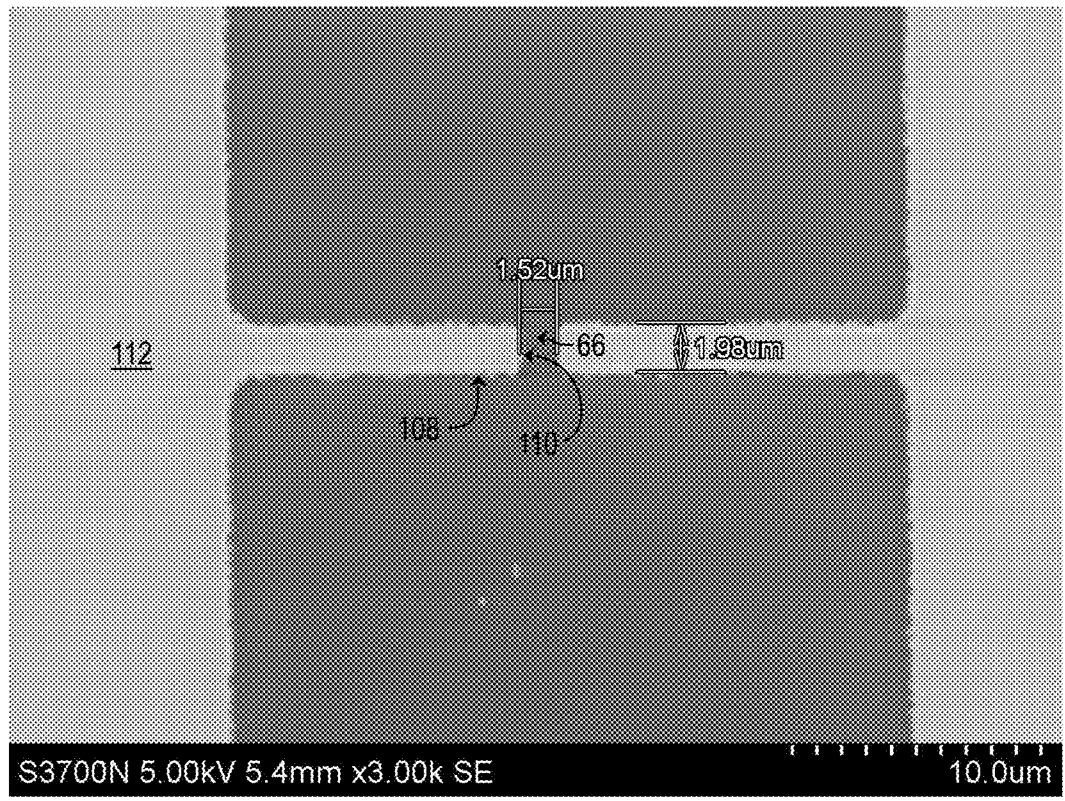

This two-step litho-etch process using patterns of photoresist 64, 68 provides for sharper definition of the hardmask material 62, so that the resulting hardmask and the etching of the source/drain material 60 and adhesion material 22 using the hardmask results in sharper feature definition. The second pattern of photoresist 68 shields the gap 66 in the hardmask material 62 formed with the first pattern of photoresist 64. As shown in FIG. 3A, the edges 100, 102 of the resulting stack 104 of hardmask material, source/drain material, and adhesion material are straighter and square or closer to square. Without the use of this two-step litho-etch process, the stack 104 of materials may be undesirably tapered, as indicated at 106. Similar sharper definition of edges 108, 110 can also be seen at the stack 112 shown in FIG. 3B.

Next, as shown in FIG. 2H, the second pattern of photoresist 68 is removed and the remaining hardmask material 62 forms a hardmask 74, which is used in subsequent etching of the source/drain material 60.

As one of ordinary skill in the art given the benefit of this disclosure will appreciate, a wide variety of processes may be used to accomplish the lithography and etching discussed above. The two-stage patterning and etching discussed above is merely an illustrative example. What is important is that the hardmask material 62 is patterned into a hardmask 74 for etching the source/drain material 60.

Next, as shown in FIG. 2I, the hardmask 74 is used to etch the source/drain material 60, such that the pattern of the hardmask 74 is transferred to the source/drain material 60 to form bodies of source material **24*s* and drain material 24*d*. The adhesion material 22 is also etched. If a non-conductive adhesion material 22** is used, it does not necessarily need to be etched.

ICPRIE may be used to etch the source/drain material 60 when ruthenium is used. Chlorine and oxygen may be used as reactant gases to etch the ruthenium. ICPRIE may also be used to etch the adhesion material 22 when titanium nitride is used. Chlorine and argon may be used as reactant gases to etch the titanium nitride.

A source pillar 76 and a drain pillar 78 are thus formed.

Subsequently, as shown in FIGS. 2J to 2N, a body of channel material 30 is formed between the source and drain pillars 76, 78. The channel material 30 is the same as the hardmask material 62, i.e., tin oxide. As will be discussed, hardmask material 62 will remain in the finished structure as reservoir material.

As shown in FIG. 2J, the method proceeds with channel interfaces **26*s*, 26*d* being formed. The inside channel-facing surfaces of the source and drain material 24*s*, 24*d* are treated, for example with plasma, to obtain source and drain channel interfaces 26*s*, 26*d***.

In various examples, plasma treatment is as follows: argon (~95%) and hydrogen (~5%) plasma for a duration of about 10 seconds; then oxygen plasma for a duration of about 60 seconds; and then nitrogen plasma for a duration of about 30 seconds. The treatment may be performed at 190°

C. and 600 W. Remote plasma processing may be used with a carrier gas, such as argon. This sequence may be repeated two or more times.

It is important to note that the faces of the source and drain material 24*s*, 24*d* opposite the substrate 20 (the upper faces in the orientation depicted) are not exposed to oxygen plasma due to the presence of the hardmask 74. As such, the upper faces of the source and drain material 24*s*, 24*d* are not oxidized, as shown at 80*s*, 80*d* respectively, and thus do not have same composition as the channel interfaces 26*s*, 26*d*.

As mentioned above, it has been found that treating the upper regions 80*s*, 80*d* of the source and drain material 24*s*, 24*d* adds capacitance and increases the threshold voltage. When these effects are undesirable, manufacturing may include removal of oxidization at these regions 80*s*, 80*d*, which requires an additional process step and takes time. The hardmask 74 reduces or eliminates the need for this removal step and thus reduces the complexity of manufacture of the TFT 10.

As shown in FIG. 2K, channel material 30 is formed, preferably by ALD, over the hardmask material 62, over the substrate 20 within gap 66 between the source and drain pillars 76, 78, and over the channel interfaces 26*s*, 26*d*. The channel material 30 is the same as the hardmask material 62, which in this example is tin oxide. In this example, the channel material 30 is formed to about 7 to about 10 nm thick.

Advantageously, the same process (e.g., ALD) and/or material (e.g., tin oxide) used to form the hardmask material 62 may be used to form the channel material 30, which may simplify the overall process of manufacturing the TFT 10. Fewer variations in the type of process and/or material reduces the complexity of manufacture. That is, if the materials of the hardmask 74 and channel material 30 were different and/or if different forming processes were used, the manufacture of the TFT 10 would be more complex and may take more time. Using the same material and/or the same process simplifies manufacture and may reduce the time required to make the TFT 10. Further, while the channel material 30 is preferably formed by ALD to obtain uniform deposition, sputtering may be used to form the hardmask material 62 with the same material, which gives up the advantage of using the same process but maintains the advantage of using the same material.

One or more process parameters may be varied to achieve desired operational behavior. For example, formation parameters such as the temperature of deposition of the hardmask material 62 and the channel material 30 may be different. For instance, the hardmask material 62 may be deposited at 300 C while the channel material 30 may be deposited at 200 C. Depositing the hardmask material 62 at a high temperature, such as 300 C, may result in more carriers being available at the source carrier reservoir 28*s* that is formed from remaining hardmask material 62, and such carrier availability may be advantageous in operation of the TFT 10. Using a lower temperature for deposition of the channel material 30 may be a practical consideration that simplifies or speeds the ALD process.

As shown in FIG. 2L, another lithographic patterning is performed, which includes applying a pattern of photoresist 82 on the channel material 30. Outer regions 84, 86 of the channel material 30 and hardmask material 62 remain exposed.

As shown in FIG. 2M, the channel material 30 and hardmask material 62 are etched according to the pattern of photoresist 82 to expose the source and drain material 24*s*, 24*d* at the outer regions 84, 86.

The remaining regions of the hardmask material 62 that previously formed the hardmask 74 thus become a source carrier reservoir 28*s* and drain reservoir 28*d* that are positioned over and in contact with the source material 24*s* and drain material 24*d*, respectively. As will now be apparent, the same material, e.g., tin oxide, is used as a hardmask, channel material, and reservoir material, which advantageously reduces process complexity while maintaining or improving performance of the resulting TFT 10.

As shown in FIG. 2N, the pattern of photoresist 82 is removed.

As shown in FIG. 2O, a layer of gate dielectric material 32, such as hafnium oxide, is formed over channel material 30, preferably by ALD.

As shown in FIG. 2P, gate material 34 is formed over the gate dielectric material 32. Gate material 34 may be selected from a variety of materials and, in this example, tungsten is used. Gate material 34 may be formed by, for example, sputtering.

Hence, as should be apparent, the structure of the TFT 10 of FIG. 1 is obtained.

Additional steps, which are omitted for sake of clarity and which will be readily apparent to those of ordinary skill in the art, may be performed as part of the method.

For example, contacts (not shown) are connected to the source 12, drain 14, and gate 16 to facilitate operation of the TFT 10.

Depending on the specific materials selected for various elements of the TFT 10 produced by the above-described method, it may be desired to perform one or more anneal operations during the method. Determining the need for such anneals and/or when in the method they are performed is well within the understanding of those of ordinary skill in the art of semiconductor fabrication and is not described further herein.

Encapsulation material, such as polyamide, spin-on glass, etc., may be formed within and/or over the structure. It is also contemplated that it may be desired to subsequently form another plane of TFTs, in accordance with the present invention, over the structure shown. In such case, encapsulation may include a layer of low-K dielectric, WTO, a layer of silicon dioxide, etc.

Figure 4:
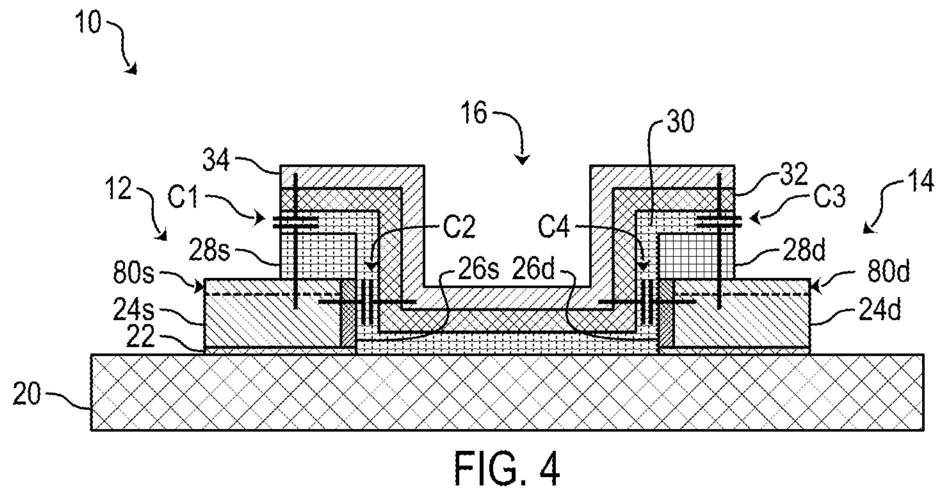
FIG. 4 is a cross-sectional view of the example thin-film transistor of FIG. 1 with simplified capacitances depicted.

FIG. 4 shows the TFT 10 discussed above with gate capacitances C1, C2, which are a simplification for sake of explanation. Capacitance C1 is mainly caused by a portion of the body of gate material 34 that overlies (in the orientation depicted) the body of source material 24*s*. Capacitance C2 is mainly caused by a portion of the body of gate material 34 that is lateral to (in the orientation depicted) the body of source material 24*s*.

Capacitance C2 is increased due to the presence of the source-channel interface 26*s*. Capacitance C1 would have a similar increase, except for the fact that material that would form the source-channel interface 26*s* at the location 80*s* is not present due to the use of the hardmask 74 which blocks formation of the source-channel interface 26*s* at this location 80*s* (see FIG. 2J and related description). Blocking treatment of source-channel interface 26*s* at the top face of the source material 24*s* is useful when an increase in capacitance C1 is undesirable.

Reducing capacitance C1 allows capacitance C2 to control the gate capacitance and thus the time it takes to reach the threshold voltage. The source-channel interface 26*s* contributes significantly to the capacitance C2 and helps to reduce current flow in the OFF state. As such, some capacitance C2 is desired. However, capacitance C1 can be reduced or eliminated to speed operation of the TFT 10.

Similar capacitances and related considerations apply to the drain 14, which has a capacitance C3 comparable to capacitance C1 and a capacitance C4 comparable to capacitance C2. The drain 14 may also be influenced by the lack of drain-channel interface 26*d* material at the upper surface of the drain material 24*d* at location 80*d*.

Figure 5:
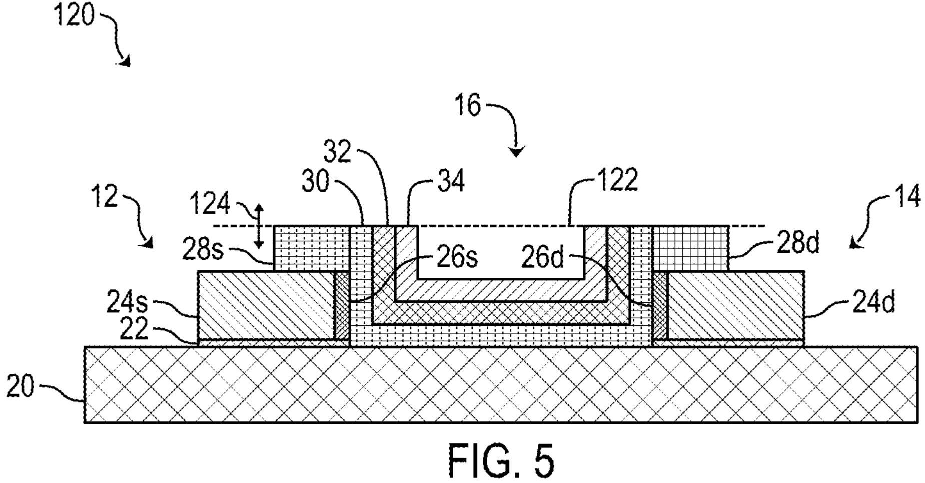
FIG. 5 is a cross-sectional view of another example thin-film transistor according to the present invention.

FIG. 5 shows another example TFT 120 according to the present invention. The TFT 120 is substantially the same as the TFT 10 of FIG. 1 except as discussed below. The above description may be referenced for details not repeated below.

The upwardly extending (in the orientation depicted) portions of the bodies of channel material 30, gate dielectric material 32, and gate material 34 may be removed to a plane 122, such as by polishing (e.g., chemical-mechanical polishing or CMP) or similar forming process. This may be done after the method action discussed above with respect to FIG. 2P.

The removal of the upwardly extending portion of the gate material 34 reduces or eliminates the capacitance C1 caused by the overlap of gate material 34 with respect to the source material 28*s*, which further increases the controlling influence of the capacitance C2. Likewise, removal of this material also reduces or eliminates the capacitance C3 caused by the overlap of gate material 34 with respect to the drain material 24*d*, which further increases the influence of the capacitance C4. Moreover, the thickness of the hardmask 74 and resulting reservoirs 28*s*, 28*d* can help control the resulting gate capacitance. That is, selecting this thickness during manufacture, as indicated by arrow 124, selects the amount of upwardly extending gate material 34, which may be used to tune the gate capacitance.

Figure 6A:
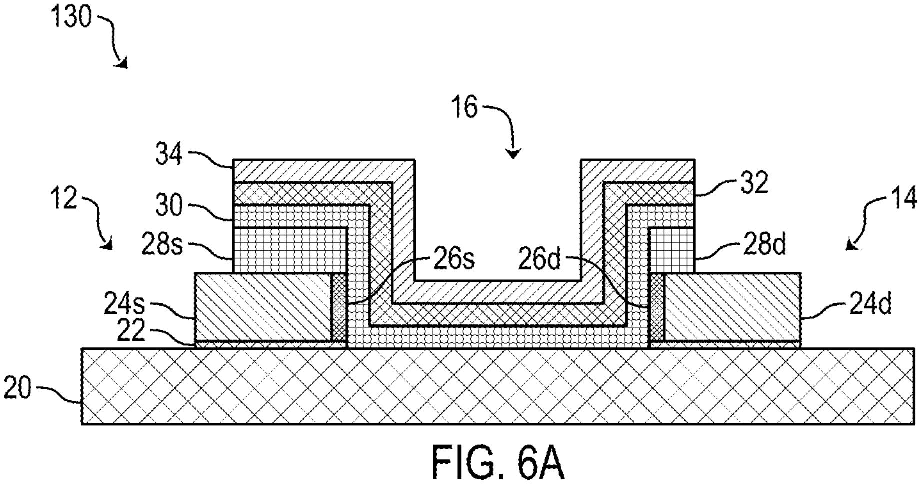
FIG. 6A is a cross-sectional view of the example thin-film transistor of FIG. 1 manufactured with suboptimal alignment.
Figure 6B:
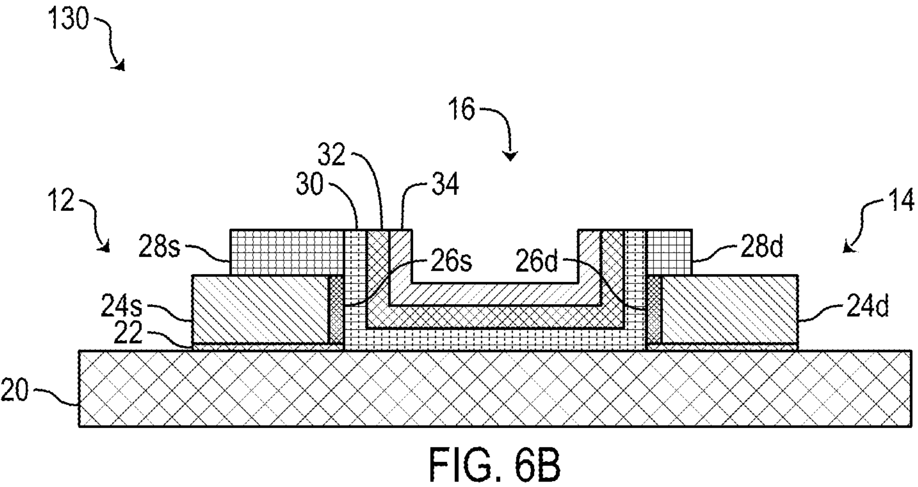
FIG. 6B is a cross-sectional view of the example thin-film transistor of FIG. 6A showing self-alignment according to the present invention.

With reference to FIGS. 6A and 6B, the self-aligning feature of the present invention will now be discussed.

FIG. 6A shows a suboptimal manufacture of a TFT 10, indicated in this figure as TFT 130, that may occur, for example, if the litho-etch discussed with regard to FIGS. 2L and 2M is inaccurate. This may occur if, for example, the photoresist 82 is improperly aligned, so as to cause the outer regions 84, 86 to be asymmetric. Capacitances C1, C2, C3, C4 may therefore not be as expected and the as-manufactured TFT 130 may operate relatively poorly compared to the desired TFT 10.

This may be corrected by a polishing (or other forming) operation that removes the upwardly extending (in the orientation depicted) portions of the bodies of channel material 30, gate dielectric material 32, and gate material 34, as shown in FIG. 6B. As can be seen, the influence of the capacitances C1, C3 (see FIG. 4) is reduced or eliminated, so that the capacitances C2, C4 (see FIG. 4) govern the gate capacitance. And since the capacitances C2, C4 were not significantly detrimentally affected by the misalignment shown in FIG. 6A, the operation of the TFT 130 is thus less susceptible to the misalignment.

In the present invention, various elements such as a source carrier reservoir and a channel material, include metal-oxide semiconductor material, such as tin oxide. This is intended to be open-ended, in that a combination of materials that include a metal-oxide semiconductor, a combination of metal-oxide semiconductors, or a metal-oxide semiconductor with a small amount of other material may be used provided that the benefits of the present invention are not unduly reduced. In other examples within the scope of the present invention, various elements such as a source carrier reservoir and a channel material, consist of, or essentially consist of, a metal-oxide semiconductor material, such as tin oxide, and exclude other materials. That is, a given element is a reasonably pure metal-oxide semiconductor, such as tin oxide.

In various examples, the tin oxide forming the body of channel material 30 is generally polycrystalline or more specifically, nanocrystalline, with a preferred crystallite orientation of Miller index <110> with respect to powder, as determined using grazing-incidence x-ray diffraction (GI-XRD) with $\omega$=0.5° on 20 nm and/or 40 nm thick samples formed on WTO. Polycrystalline tin oxide with this preferred crystal orientation provides good carrier mobility and good stability, which improves the performance and useful life of the TFT.

For sake of clarity, tin oxide with an orientation of <110> means that one of the directions in the family of directions <110>, such as direction [110], is substantially normal to the plane of the substrate 20. In other words, a plane of the family {110}, such as the plane (110), is substantially parallel to the plane of the substrate 20.

The crystallinity of the thin film of tin oxide is preferably at least about 80%, more preferably at least about 85%, more preferably at least about 90%, and still more preferably at least about 95%. Regions outside the 20 angular range of 20-60° may be ignored when computing crystallinity.

In various examples, the hardmask 62, which ultimately forms the reservoirs 28*s*, 28*d*, is formed using the same process parameters used for forming the body of channel material 30. This may result in the reservoirs 28*s*, 28*d* having the same or similar same crystal structure as the body of channel material 30.

In view of the above, it should be apparent that a TFT may be made with a hardmask to etch source/drain material. A portion of the hardmask may remain in the TFT as a source carrier reservoir and, optionally, a drain reservoir. Channel material may be the same as the hardmask material, which may reduce the number of different materials required to make the TFT and reduce the complexity of the manufacturing process.

In the above description, auxiliary verbs "can" and "may" are used interchangeably herein to denote components, features, and/or aspects of the present invention that are capable, configurable, selectable, modifiable, or optional, as would be apparent to one of ordinary skill in the art given the benefit of this disclosure. These terms should not be taken as limiting the present invention, unless otherwise specified.

Spatial prepositions, such as "over", "under", "above", "below", "up", "down", "beside", etc., are provided for sake of explanation and should not be taken as limiting the present invention to an absolute spatial orientation or arrangement, unless otherwise specified. For example, one of ordinary skill in the art would understand that a first element is above or below a second element depending on the perspective of the observer.

The articles "a", "an", "the", "said", etc. indicate singular and plural, unless otherwise specified.

The conjunction "or" is used inclusively and should be understood to mean "and/or", unless otherwise specified.

Sets of elements A, B, C described as A, B, or C; A, B, and C; A, B, and/or C; or A, B, C should be considered open sets from which one or more elements or a combination of one or more elements may be selected, unless otherwise specified. Sets of elements are open, unless specified to be closed, for example, by use of the term "consist", "consisting", or similar closed language.

The above clarifications apply to both the specification and claims.

The figures are not to scale, unless otherwise specified.

The above-described embodiments of the invention are intended to be examples of the present invention and alterations and modifications may be effected thereto, by those of ordinary skill in the art, without departing from the scope of the invention which is defined solely by the claims appended hereto.

The invention claimed is:

1. A method of manufacturing a thin-film transistor, the method comprising:

forming a layer of source/drain material;

forming a layer of hardmask material on the source/drain material;

patterning the layer of hardmask material to form a hardmask; and transferring a pattern of the hardmask to the source/drain material to form a source and a drain;

completing forming of the thin-film transistor without removing a remaining portion of the hardmask material, the remaining portion of the hardmask material remains in the thin-film transistor over the source as a source carrier reservoir, the source carrier reservoir being configured to supply charge carriers adjacent the source during operation of the thin-film transistor.

2. The method of claim 1, wherein additional remaining portion of the hardmask material remains in the thin-film transistor over the drain as a drain reservoir.

3. The method of claim 1, further comprising:

forming a layer of channel material between the source and drain;

wherein the channel material is the same as the hardmask material.

4. The method of claim 3, wherein the forming of the layer of hardmask material and the forming of the layer of channel material are performed by the same process.

5. The method of claim 4, wherein the process comprises atomic layer deposition.

6. The method of claim 4, wherein a parameter of the process is changed between the forming of the layer of hardmask material and the forming of the layer of channel material.

7. The method of claim 6, wherein the parameter is temperature.

8. The method of claim 1, wherein the hardmask material comprises a metal-oxide semiconductor.

9. The method of claim 8, wherein the hardmask material is tin oxide.

10. A method of manufacturing a thin-film transistor, the method comprising:

forming a layer of source/drain material;

patterning the source/drain material to form a source and a drain;

forming a source carrier reservoir of reservoir material at the source; and forming a layer of channel material between the source and drain;

wherein the channel material is the same as the reservoir material, wherein the source carrier reservoir remains in the thin-film transistor after forming of the thin-film transistor is completed, and wherein the source carrier reservoir is configured to supply charge carriers adjacent the source during operation of the thin-film transistor.

11. The method of claim 10, further comprising:

forming a layer of the reservoir material on the source/drain material;

patterning the layer of reservoir material to form a hardmask; and transferring a pattern of the hardmask to the source/drain material to form the source and the drain;

completing forming of the thin-film transistor without removing a remaining portion of the reservoir material, the remaining portion of the reservoir material remains in the thin-film transistor over the source as the source carrier reservoir.

12. The method of claim 10, further comprising:

forming a drain reservoir of the reservoir material at the drain.

13. The method of claim 10, wherein the source/drain material comprises ruthenium.

14. The method of claim 10, wherein the reservoir material and the channel material comprise a metal-oxide semiconductor.

15. The method of claim 14, wherein the reservoir material and the channel material are tin oxide.

16. A method of manufacturing a thin-film transistor, the method comprising:

forming a layer of source/drain material;

forming a layer of metal-oxide semiconductor on the source/drain material;

patterning the layer of metal-oxide semiconductor to form a hardmask; and transferring a pattern of the hardmask to the source/drain material to form a source and a drain of the thin-film transistor;

completing forming of the thin-film transistor without removing a remaining portion of the metal-oxide semiconductor, the remaining portion of the metal-oxide semiconductor remains in the thin-film transistor over the source as a source carrier reservoir, the source carrier reservoir being configured to supply charge carriers adjacent the source during operation of the thin-film transistor.

17. The method of claim 16, wherein the metal-oxide semiconductor is tin oxide.

* * * * *